United States Patent
Belanger et al.

(10) Patent No.: US 7,952,205 B2
(45) Date of Patent: May 31, 2011

(54) INJECTION MOLDED SOLDERING PROCESS AND ARRANGEMENT FOR THREE-DIMENSIONAL STRUCTURES

(75) Inventors: Luc Belanger, Quebec (CA); David Danovitch, Quebec (CA); John U. Knickerbocker, Monroe, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/839,214

(22) Filed: Jul. 19, 2010

(65) Prior Publication Data

US 2010/0276813 A1      Nov. 4, 2010

Related U.S. Application Data

(62) Division of application No. 11/670,543, filed on Feb. 2, 2007.

(51) Int. Cl.
*H01L 29/40* (2006.01)
(52) U.S. Cl. .............................. 257/777; 438/109
(58) Field of Classification Search ............... 257/777
See application file for complete search history.

(56) References Cited

U.S. PATENT DOCUMENTS

| | | | |
|---|---|---|---|
| 5,775,569 A | 7/1998 | Berger et al. | |
| 5,971,058 A * | 10/1999 | Bolde et al. | 164/130 |
| 6,222,265 B1 | 4/2001 | Akram et al. | |
| 6,664,644 B2 * | 12/2003 | Morozumi | 257/777 |
| 6,913,949 B2 | 7/2005 | Pflughaupt et al. | |
| 2006/0071314 A1 * | 4/2006 | Ho et al. | 257/685 |
| 2006/0076671 A1 * | 4/2006 | Kariya et al. | 257/702 |

FOREIGN PATENT DOCUMENTS

TW         255023         5/2006

* cited by examiner

*Primary Examiner* — Thao X Le
*Assistant Examiner* — Kimberly Trice
(74) *Attorney, Agent, or Firm* — Scully, Scott, Murphy & Presser, P.C.; Vazken Alexanian

(57) ABSTRACT

A method of implementing an injection molded soldering process for three-dimensional structures, particularly, such as directed to three-dimensional semiconductor chip stacking. Also provide is an arrangement for implementing the injection molded soldering (IMS) process. Pursuant to an embodiment of the invention, the joining of the semiconductor chip layers with a substrate is implemented, rather than by means of currently known wire bond stacking, through the intermediary of columns of solder material formed by the IMS process, thereby providing electrical advantages imparted by the flip chip interconnect structures. In this connection, various diversely dimensioned solder column interconnects allow for simple and dependable connections to a substrate by a plurality of superimposed layers or stacked arrays of semiconductor components, such as semiconductor chips. In accordance with a further aspect, it is possible to derive a unique design for an IMS mold structure, which contains cavities for forming the columnar fill of solder, and which also incorporates further cavities acting as cutouts for dies or the positioning of other electronic packages or modules.

12 Claims, 5 Drawing Sheets

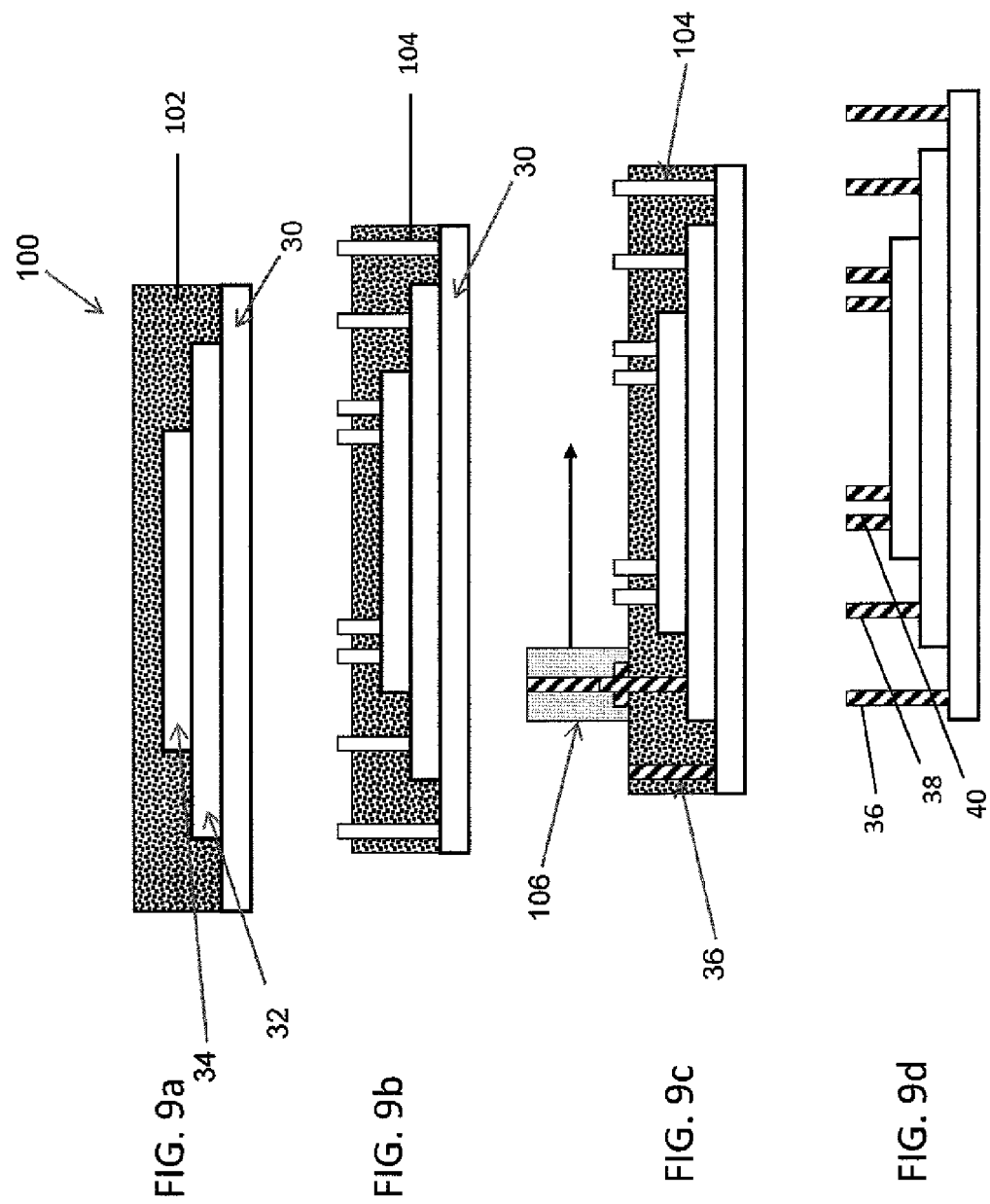

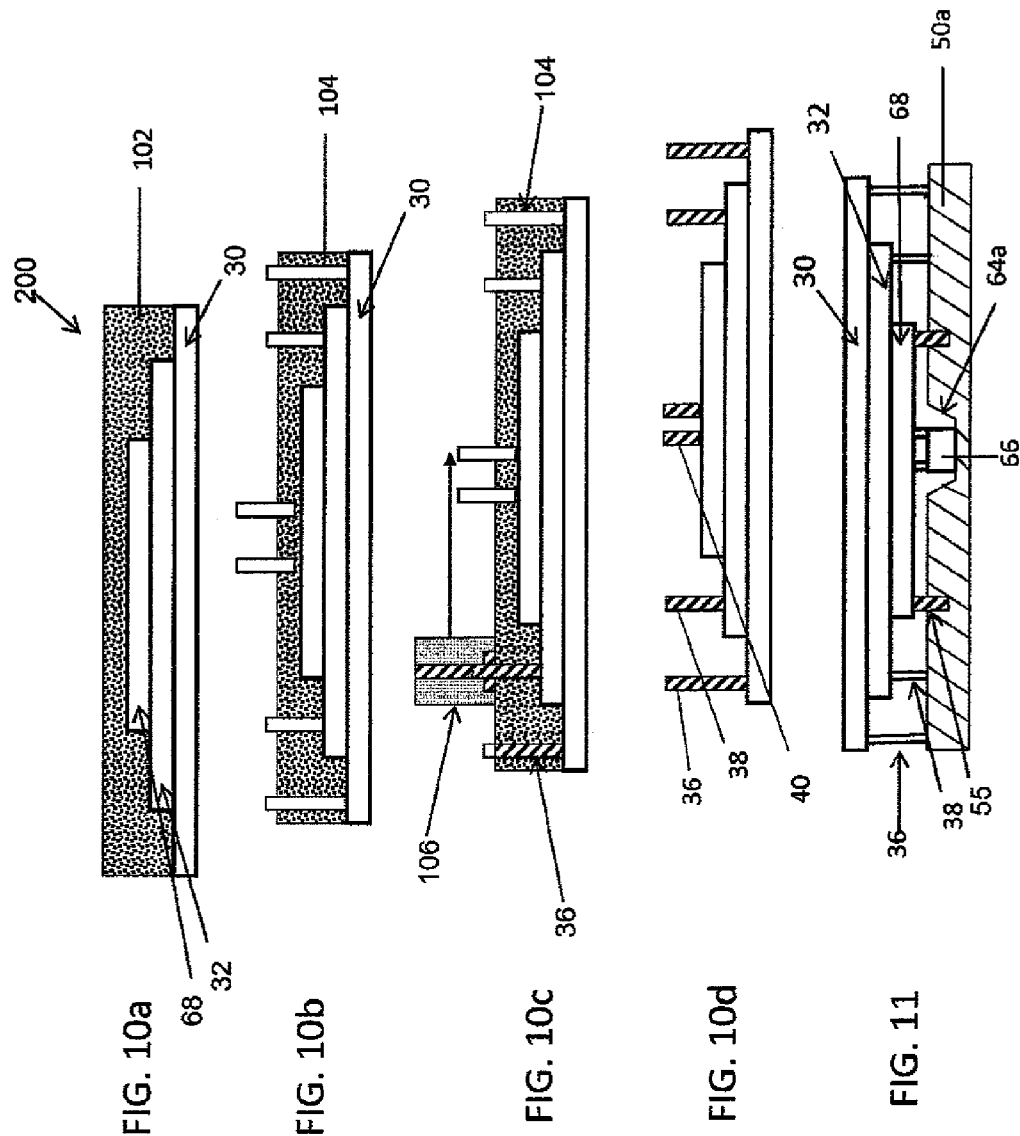

US 7,952,205 B2

INJECTION MOLDED SOLDERING PROCESS AND ARRANGEMENT FOR THREE-DIMENSIONAL STRUCTURES

RELATED APPLICATIONS

This application is a divisional of U.S. Ser. No. 11/670,543, filed Feb. 2, 2007, the entire contents of which are incorporated herein by reference.

BACKGROUND OF THE INVENTION

1. Field of the Invention

The present invention relates to a method of implementing an injection molded soldering process for three-dimensional structures, particularly, such as directed to three-dimensional semiconductor chip stacking. Furthermore, the invention is also directed to an arrangement for implementing the injection molded soldering (IMS) process and to a product obtained thereby.

Basically, in the current state of the technology, in implementing the forming or manufacture of so called three-dimensional semiconductor chip stacking, there is employed an injection molded soldering (IMS) process, which may also be referred to as a "C4NP" process (Controlled Collapse Chip Connection New Process). In essence, the IMS process may be considered a transfer mold process in which a mold, which is equipped with a plurality of sites for the placement of solder, such as cavities formed in a mold plate into which the solder can be positioned or injected, and wherein these sites may be provided at various locations and possess diverse geometries. Once the mold is filled with the unique and required configurations of solder in the placement locations, the formed material or solder can then be transferred to a semiconductor die or module and serve as a suitable interconnect for the semiconductor chip or chips.

The present state of the technology in manufacturing stacked semiconductor chips in various aspects normally employs the use of wire bonds which lead from a substrate to the respective semiconductor chip, and upon occasion as required, from semiconductor chip to semiconductor chip in the diverse superimposed or stacked layers of the structure. In some instances, a die can be thinned and through vias formed for direct semiconductor chip-to-chip joining, whereupon a dielectric material may then thereafter suitably encapsulate the structure, as is well known in the art.

Other more recent advances in the technology employ solder, such as solder balls and/or solder bumps for implementing various methods in effecting the stacking of semiconductor chips. In that instance, individual units or modules may have the chips mounted on dielectric layers, and provided with conductive traces on the dielectric layers interconnecting contacts on the semiconductor chips with terminals, which are disposed in peripheral regions of the dielectric layers.

Still further advances in the technology combine the above-mentioned concept of wire bonding the superimposed semiconductor chip layers and solder interconnections, wherein the solder connections may, upon occasion, pass through vias, which are formed in materials connecting the semiconductor chip layers, and wherein various pads are then connected to the interconnecting traces by means of wire bonds and then suitably encapsulated in a dielectric material.

However, the extent of the presently continuous advances in the technology in the formation or evolution of ever denser or miniaturized three-dimensional electronic packaging arrangements and other improvements imparted to such electronic packaging; for example, in the employment of superimposed layers of semiconductor chips or electronic components, are subject to limitations or restrictions in their abilities to provide a comprehensive structure, which is capable of effectively combining various sizes and configurations of solder interconnects on a single level, while at the same time be able to accommodate other electronic packages and components which are present within the stack of semiconductor chips or the three-dimensional package which has been formed.

2. Discussion of the Prior Art

Various prior art publications are presently in existence, which either provides for wire bonding or combinations of solder connections and wire bonding, such as for multiple layers of semiconductor chips or similar components of electronic package arrangements.

In connection with the foregoing, wire-bonding methods for multiple electronic layers, such as semiconductor chips, are illustrated in Pflughaupt, et al., U.S. Pat. No. 6,913,949 B2, wherein a stacked chip assembly includes individual units having chips mounted on dielectric layers and traces on the layers interconnecting contacts of the chips with terminals, which are located in the peripheral regions of the dielectric layers. In that manner, there are provided solder connections and solder bumps for chip stacking.

Pursuant to the prior art, a combination of wire bonding and solder interconnections for multiple layers of semiconductor chips is disclosed in Akram, et al., U.S. Pat. No. 6,222,265 B1, wherein a semiconductor chip package includes multiple stacked substrates having flip chips attached to a substrate with chip-on-dashboard assembly techniques utilizing combinations of electrical connections through the use of solder, and also in a combination with wire bond connections.

The foregoing patent publications provide disclosures which are limited in their particular abilities to meet the requirements of the ever-increasingly demanding electronic packaging technologies, and whereby the current limitations in structure and configuration are inventively solved by the present invention, which provides various structures that are rendered available through the unique IMS processes, so as to produce an improved and simplified three-dimensional semiconductor chip stacking structure.

SUMMARY OF THE INVENTION

Accordingly, pursuant to a first embodiment of the invention, the joining of the semiconductor chip layers with a substrate is implemented, rather than by means of currently known wire bond stacking, through the intermediary of columns of solder material formed by the IMS process, thereby providing mechanical reliability, electrical and/or cost advantages imparted by the flip chip interconnect structures. In this connection, various diversely dimensioned solder column interconnects allow for simple and dependable connections to a substrate by a plurality of superimposed layers or stacked arrays of semiconductor components, such as semiconductor chips.

In accordance with a further aspect of the present invention, it is possible to derive a unique design for an IMS mold structure, which contains cavities for forming the columnar fill of solder, and which also incorporates further cavities acting as cutouts for dies or the positioning of other electronic packages or modules.

In that connection, the injection molded soldering (IMS) process can be readily modified to accommodate the use of the cutout cavities, which contain the dies or modules and inhibiting the injection of solder along central rows of module carriers where the semiconductor chips would be located. Pursuant to further modification, it is contemplatable to initially fill all of the columnar cavities and cutout cavities, and to then utilize a specially designed wettable fixture and a transfer operation to remove solder from only the cavity cutouts, so as to enable the positioning therein of the respective dies, electronic packages or modules.

It is, accordingly, an object of the present invention to provide an injection molded soldering process for three-dimensional structures.

A more specific object of the invention resides in the provision of an injection molded soldering process, which is directed to the manufacture of three-dimensional semiconductor chip stacks.

Another object of the present invention resides in the provision of an arrangement including a mold structure for implementing the injection molded soldering process, as described herein.

BRIEF DESCRIPTION OF THE DRAWINGS

Reference may now be made to the following detailed description of the invention, taken in conjunction with the accompanying drawings; in which:

FIGS. 9a-9d are cross sectional side elevational views which illustrate a method according to an embodiment of the invention eventuating in the package of FIG. 3, wherein FIG. 9a includes the superimposed array of semiconductor chips as shown in FIG. 3, and a layer of resist coat;

FIG. 9b includes etched vertical columns;

FIG. 9c includes an IMS head for solder filling the vertical columns;

FIG. 9d depicts the resist removed and solder filled vertical columns;

FIGS. 10a-10d are cross sectional side elevational views which illustrate a method according to an embodiment of the invention eventuating in the package of FIG. 11, wherein FIG. 10a includes a superimposed array of semiconductor chips, a carrier, and a layer of resist coat;

FIG. 10b depicts etched vertical columns;

FIG. 10c depicts an IMS head for solder filling the vertical columns;

FIG. 10d depicts the resist removed and solder filled vertical columns; and

FIG. 11 depicts the superimposed array of semiconductor chips on a mold.

DETAILED DESCRIPTION OF THE INVENTION

Figure 1:
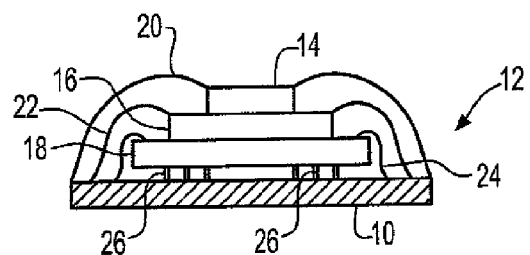
FIG. 1 illustrates a schematic representation of a multi-layered or three-dimensional semiconductor chip array, in which the chip layers are connected to a substrate through the intermediary of pluralities of wire bonds pursuant to the prior art.

Referring in more specific particularity to FIG. 1 of the drawings, representative of the prior art, there is diagrammatically illustrated a substrate 10, which is utilized in connection with the formation of electronic packages 12 on which there are arranged a plurality of superimposed or stacked semiconductor chips 14, 16, 18, which may be suitably internally conductively interconnected, and which are equipped with pluralities of wire bonds 20, 22, 24 connecting the respective chips to connections or traces 26 on the surface of the substrate 10, as is well known in the technology. These wire bonds may, of course, be encapsulated with a suitable dielectric material (not shown), as is also well known in the technology.

Figure 2:
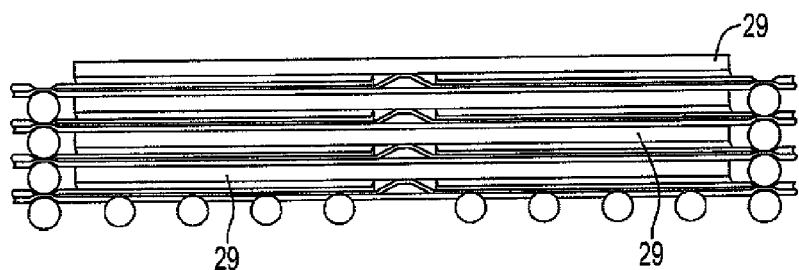
FIG. 2 illustrates a side view of an arrangement showing the connections of a plurality of superimposed layers of semiconductor chips by means of solder and/or solder bumps pursuant to the prior art wherein the solder bumps are only on the surface of each semiconductor chip and are of equal dimension and wherein the superimposed semiconductor chips are interconnected by the use of additional substrate layers between each said semiconductor chip and solder connections between each substrate layer.

More recently, for example, as also embodied in the disclosure of the above-referenced U.S. Pat. No. 6,913,949, and as shown in FIG. 2 of the drawings, the respective array of superimposed layers of semiconductor chips 29 may be interconnected internally by means of solder bumps and intermediate substrate layers with connections extending beyond the edges of the semiconductor chips.

Also represented in U.S. Pat. No. 6,222,265 B1, the various layers of semiconductor chips may also be interconnected through vias by means of electrically conductive solder contacting pads and traces on the chips and, moreover, further electronic components or pads on the chips may be connected by means of wire bonds, all of these solder connections and wire bonds generally being embedded in a dielectric underfill material.

Figure 3:
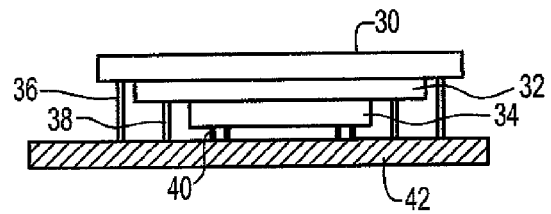
FIG. 3 illustrates an embodiment consisting of a superimposed array of semiconductor chips connected to a substrate by means of the inventive IMS-formed columns of solder.

As illustrated in FIG. 3 of the drawings, pursuant to the invention, in lieu of both the wire bonds and the internal connections of the prior art, in this instance, as diagrammatically or schematically illustrated, a plurality of superimposed semiconductor chips 30, 32, 34 has the electrical solder connections provided in the form of columns 36, 38, 40 through applying the IMS process, so as to contact suitable electrical components or connections (not shown) on the surface of a substrate 42, and wherein the variously sized solder columns form the chips-substrate interconnects.

Figure 4:
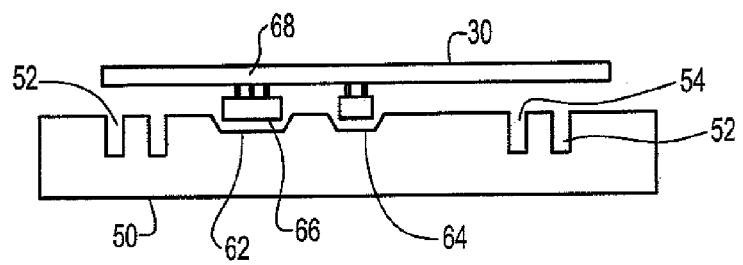
FIG. 4 illustrates an IMS mold designed to contain cavities for columns filled with solder, and with further cavities which act as cutouts for dies, stacked die with through silicon vias or holes or other 3D electronic package structures or stacked die or stacked packages and stacked die.

A mold 50, as shown in FIG. 4, containing cavities 52, 54 of various depths has the cavities filled with solder to form columns and subsequently transferred thereon to a chip carrier 68 or an array of chip carriers, which can then be either sequentially placed or gang reflowed, or these can be pre-assembled as a laminated stack and then gang placed and gang reflowed. The advantage in providing a single interconnection step in forming these solder columns, is that it provides a high degree of accuracy in the X, Y and Z directions between different sets of interconnected heights of columns, since they are precisely dictated by the design and configuration of the IMS mold cavities 52, 54.

As generally diagrammatically shown in FIG. 4 of the drawings, the mold 50 contains the cavities 52, 54 for the forming therein of the solder columns and also further cavities 62, 64 for receiving therein either further chips 66 or the like components which are connected to a silicon carrier 68 or other substrate.

It is also possible that all IMS interconnects can be positioned at a single time, or if the mold die includes C4 type of interconnects to an adjacent die, it is possible to join and reflow the IMS interconnects and the mold die-to-die interconnects in a single step.

The top layer of the stacked three-dimensional structure would now be the largest sized die, reverting to FIG. 4, and which increase in size of the stack 30, 32, 34 to the lid and heat sink area of the superimposed chips to provide a greater dissipation of heat improving thermal management and eliminating to a large extent the portion of heat which previously passed through the substrate 42.

Alternatively a stacked three-dimensional structure could be fabricated wherein the stacked die or thinned stacked die or stacked die and package contain through silicon vias and/or holes whereby the electrical interconnections between the stacked die, stacked die and package and/or stacked die, package and heat sink may be filled and interconnected using the IMS or C4NP process.

Figure 5:
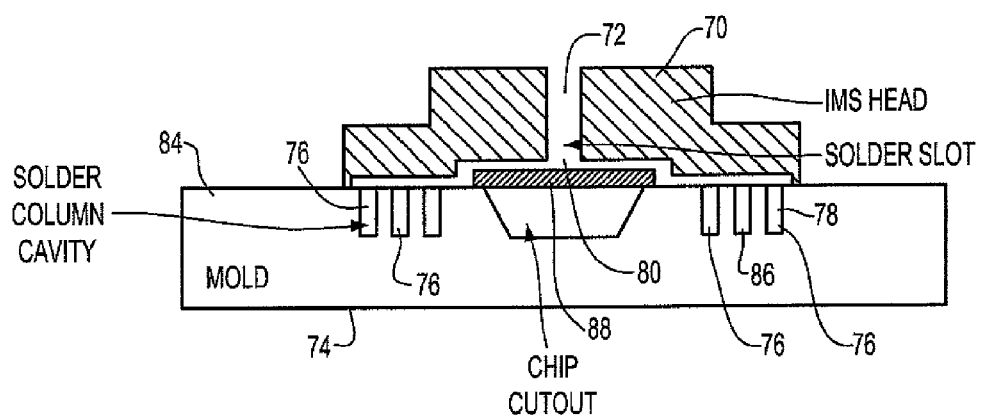
FIG. 5 illustrates a first filler head arrangement for filling a mold with the solder columns and providing a chip cutout structure.
Figures 6A, 6B:
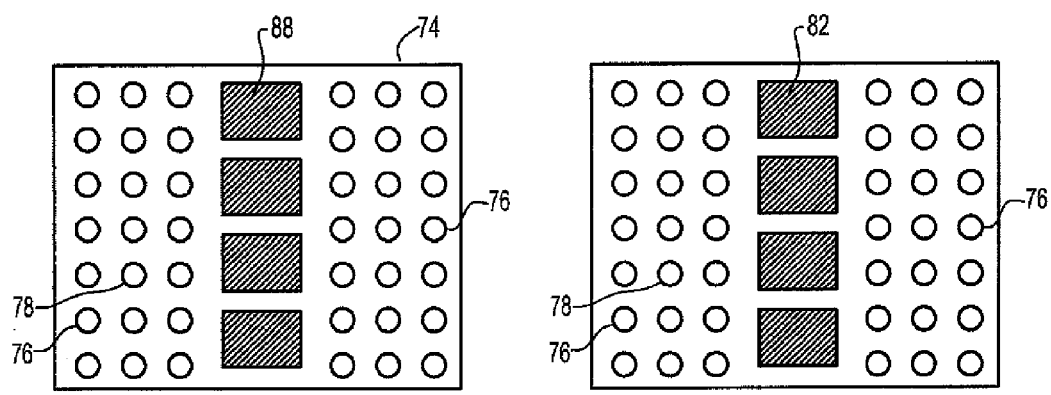
FIGS. 6a and 6b illustrate, respectively, diagrammatic plan views of two embodiments of a mold design for employing the IMS process in a chip stacking arrangement.

As illustrated in FIG. 5 of the drawings, in that instance, an IMS filler head 70 includes a central filling passageway 72, such that a mold 74 positioned therebeneath, and which possesses a plurality of cavities 76 for the forming of solder columns, has the cavities adapted to be filled with solder material 78 supplied through the solder filling slot 80 in the filler head 70. A chip cutout 82, which is arranged at strategic locations on the surface 84 of the mold 74, which contains the solder column cavities 76, may be covered during the solder filling process by a plate-like component 88, so as to prevent solder from filling the chip cutout 82 during the IMS solder filling process. Referring to the plan view of FIG. 6a, a mold 74 may contain a plurality of plate-like components 88 and cavities 76 for the infeed of solder material 78 to produce the solder columns 86 in cavities 76, simultaneously, may be provided, as shown in the diagrammatic plan view of a mold 74 designed for large-scale production processing. Alternatively, the plate-like component 88 can be integrated into the IMS filler head 70 such that solder material 78 routes from the central filling passageway 72 to specific solder filling slots 80 wherein the chip cutouts 82 are strategically located on mold 74 (as shown in FIG. 6b) to be aligned with the location of the integrated plate-like component 88.

Figure 7:
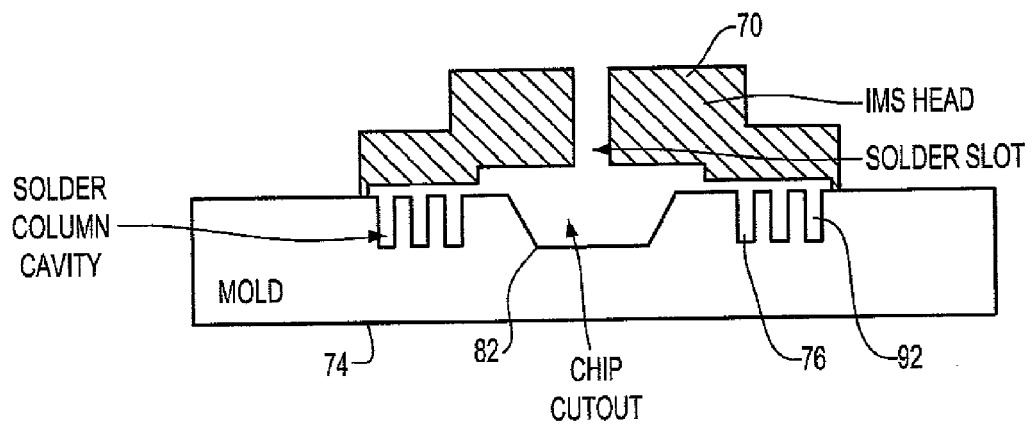
FIG. 7 illustrates a modified embodiment for filling a mold with solder columns and also filling a cavity.
Figure 8:
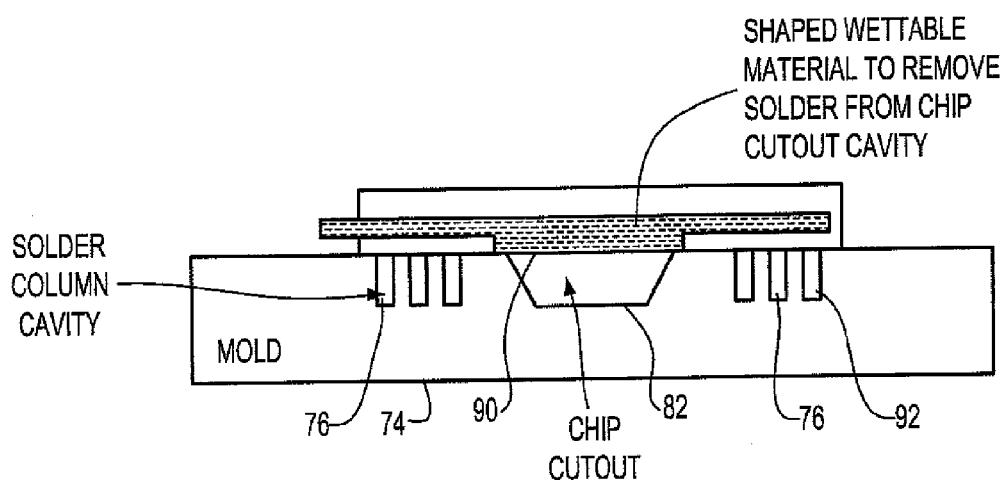
FIG. 8 illustrates a mold including an arrangement for removing solder from a chip cutout cavity.

Alternatively, as shown in FIGS. 7 and 8, wherein identical or similar components are identified with the same reference numerals as in the embodiment of FIG. 5 of the drawings, in that case, the component 88 shown in FIG. 5, which blocks the chip cutout 82 from receiving the filling solder, is eliminated and permits this cavity 82 to be filled with solder concurrently with the filling of the solder column cavities 76.

In this instance, subsequent to the filling of the solder column cavities 76 and chip cutout cavity 82 with the solder material 78, a shaped wettable material is applied to the mold surface portion 90 above the cavity 82, so as to remove the solder material from the chip cutout cavity 82, and then in a transfer operation permitting the chip cutout cavity or cutout cavities to be utilized in connection with the insertion of the required semiconductor chip or chips, or other electronic component or components (not shown), while employing the solder columns 92 in cavities 76 to form the desired electrical connections to the chip arrays on the chip carrier, as previously described in connection with FIG. 3 of the drawings.

Referring to FIGS. 9a-9d, an embodiment of the method of the present invention is depicted which eventuates in the embodiment of the invention shown in FIG. 3, wherein the same elements have like reference numerals. Referring to FIG. 9a, a chip package 100 for fabrication includes a resist coat 102 (or a dielectric mold) covering the semiconductor chips 30, 32, 34. In FIG. 9b, columns are etched in the resist coat to form solder column cavities 104. An IMS head 106 used in the IMS process moves in the direction indicated by the arrow as it fills the solder column cavities 104, resulting in solder columns 36, 38, 40, also shown in FIG. 3. Referring to FIG. 9d, the resist coat in removed resulting in solder columns 36, 38, 40 attached to each of the respective chips 30, 32, 34. However, in an alternative embodiment (not shown), a dielectric resist layer over the array of semiconductor chips may be retained. Thereby, the method results in the array of semiconductor chips 30, 32, 34 with respective solder columns 36, 38, 40 as shown in FIG. 9d, which is subsequently transposed onto substrate 42 as shown in FIG. 3.

Referring to FIGS. 10a-10d and FIG. 11, an embodiment of the method of the present invention is depicted which eventuates in the embodiment of the invention shown in FIG. 11, wherein the same elements have like reference numerals of previous Figures. Referring to FIG. 10a, a chip package 200 for fabrication includes a resist coat 102 (or a dielectric mold) covering the semiconductor chips 30, 32, and silicon carrier 68. In FIG. 10b, columns are etched in the resist coat to form solder column cavities 104. An IMS head 106 used in the IMS process moves in the direction indicated by the arrow as it fills the solder column cavities 104, resulting in solder columns 36, 38, 40, as shown in FIGS. 10c-10d. Referring to FIG. 10d, the resist coat in removed resulting in solder columns 36, 38, 40 attached to each of the respective chips 30, 32, and silicon carrier 68. However, in an alternative embodiment (not shown), a dielectric resist layer over the array of semiconductor chips may be retained. Referring to FIG. 11, the method results in the array of semiconductor chips 30, 32, and silicon carrier 68 with respective solder columns 36, 38, 40, and solder columns 55 formed in the mold 50a. As shown in FIG. 11, a component 66 connected to solder columns 40 (also shown in FIG. 4) is positioned in cavity 64a which is formed in the mold 50a.

From the foregoing, it becomes readily evident that the present invention provides a distinct advantage over the prior art in forming electrical connects for pluralities or arrays of superimposed semiconductor chips or similar electronic devices.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but to fall within the spirit and scope of the appended claims.

What is claimed is:

1. A method for conductively joining a plurality of superimposed layers of semiconductor components to a mold, said method comprising:

forming a plurality of solder columns through injection molded soldering;

having said formed solder columns electrically connecting each said semiconductor component of a respective superimposed layer of said semiconductor components with electrical components and connections on said mold having cavities;

filling at least some of said cavities with said solder to form additional solder columns;

transferring said mold with said additional solder columns to a carrier for said semiconductor component layers;

causing said additional solder columns to be adhered to said semiconductor components to produce the conductive connections therewith;

forming cutouts in said mold for receiving additional semiconductor components for attachment to said carrier by at least some of said cavities being devoid of solder;

locating a filler head for extruding solder above said mold for filling solder into said cavities to form said solder columns;

filling said cutouts with solder extruded from said solder filler head; and applying a shaped wettable material to said cutouts to remove solder therefrom and facilitate the positioning therein of semiconductor chips or electronic components.

2. A semiconductor component arrangement for conductively joining a plurality of superimposed layers of semiconductor components to a mold, said arrangement comprising:

a plurality of solder columns formed by injection molded soldering;

said formed solder columns electrically connecting each said semiconductor component of a respective superimposed layer of said semiconductor components with electrical components and connections on a mold; and said mold having cavities, at least some of said cavities being filled with solder to form additional solder columns, said mold with said additional solder columns being transferable to a carrier for mating with said semiconductor component layers, and said solder columns and said additional solder columns being adhered to said semiconductor components to produce the conductive connections therewith, wherein at least some of said cavities are devoid of solder to form a cutout in said mold and receive a additional semiconductor component being attached to one of said semiconductor component layers.

3. An arrangement as claimed in claim 2, wherein said semiconductor components comprise superimposed layers of semiconductor chips.

4. An arrangement as claimed in claim 3, wherein each said superimposed layer of chips is larger-sized than a chip layer located therebeneath, whereby the uppermost chip layer forms a large surfaced heat-dissipating member attachable to a heat sink.

5. An arrangement as claimed in claim 2, wherein each said semiconductor component layer is connected to said mold by said injection molded solder columns independently of the connections of the other semiconductor component layers to said mold.

6. An arrangement as claimed in claim 2, wherein a filler head for extruding solder is locatable above said mold for filling solder into said cavities to form said solder columns.

7. An arrangement as claimed in claim 6, wherein a structure is provided for blocking solder from being extruded into said cutouts from said solder filler head.

8. An arrangement as claimed in claim 6, wherein said cutouts are filled with solder extruded from said solder filler head; and a shaped wettable material is applied to said cutouts to remove solder therefrom and facilitate the positioning therein of semiconductor chips or electronic components.

9. An arrangement as claimed in claim 2, wherein said semiconductor components comprise superimposed layers of stacked semiconductor chips or stacked and thinned semiconductor chips which have through silicon vias and or holes.

10. An arrangement as claimed in claim 9, wherein each said superimposed layer of stacked chip or chips is the same size or different than a chip layer located adjacent within the stack or whereby the stacked chip or chips and package or packages forms a interconnected 3D structure which can provide electrical, mechanical and thermal interconnection to the surface and or to a heat sink.

11. An arrangement as claimed in claim 9, wherein each said semiconductor component layer is connected to other semiconductor components, said mold, and/or a heat sink by said solder columns and said additional solder columns using said through silicon vias or holes independently of connections within each of said semiconductor component, mold, or heat sink.

12. A method for conductively joining a plurality of superimposed layers of semiconductor components to a substrate or mold, said method comprising:

forming a plurality of solder columns through injection molded soldering and connecting said plurality of solder columns to each of a respective superimposed layer of semiconductor components including a carrier being positioned at the bottom of said respective superimposed layers of said semiconductor components, said carrier being connected to a component by said solder columns;

having said formed solder columns electrically connecting each said semiconductor component of said respective superimposed layers of said semiconductor components with electrical components and connections on said mold; and said mold having cavities;

filling at least some of said cavities in said mold with solder to form additional solder columns using injection molded soldering;

transferring said respective superimposed layers of said semiconductor components with said solder columns to said mold causing said solder columns to be adhered to an additional semiconductor component and said mold and causing at least some of said solder columns in said mold to connect with said carrier to produce the conductive connections between said semiconductor components and said mold, and wherein at least one of said cavities in said mold is devoid of solder to form a cutout in said mold for receiving said additional semiconductor component;

locating a filler head for extruding solder above said mold for filling solder into said cavities to form said solder columns;

filling said cutouts with solder extruded from said solder filler head; and applying a shaped wettable material to said cutouts to remove solder therefrom and facilitate the positioning therein of semiconductor chips or electronic components.

* * * * *